United States Patent [19]

Citta

[11] 4,072,909

[45] Feb. 7, 1978

[54] AUTOMATIC PHASE AND FREQUENCY CONTROL SYSTEM

[75] Inventor: Richard W. Citta, Oak Park, Ill.

[73] Assignee: Zenith Radio Corporation, Glenview, Ill.

[21] Appl. No.: 727,095

[22] Filed: Sept. 27, 1976

[51] Int. Cl.² .............................................. H03B 3/04
[52] U.S. Cl. ....................................... 331/12; 331/17; 331/25; 331/31
[58] Field of Search ........................ 331/11, 12, 17, 18, 331/25, 30–32

[56] References Cited

U.S. PATENT DOCUMENTS

| | | | |
|---|---|---|---|
| 2,522,371 | 9/1950 | Guanella et al. | 331/12 |
| 3,768,030 | 10/1973 | Brown et al. | 331/12 |
| 3,789,316 | 1/1974 | Goetz et al. | 331/12 |

Primary Examiner—Siegfried H. Grimm
Attorney, Agent, or Firm—Nicholas A. Camasto; Roy A. Ekstrand

[57] ABSTRACT

An automatic phase and frequency control system includes a pair of multipliers coupled to a source of input signal. A voltage controlled oscillator is also coupled to each of the multipliers. Means are provided to phase shift the oscillator signal at one multiplier such that quadrature beat signals are produced. The output of one of the multipliers is coupled directly to a third multiplier while the output of the other is coupled to a low pass filter. The filtered signal is amplitude limited and applied to the third multiplier. A second low pass filter couples the output of the third multiplier to the frequency control input of the voltage controlled oscillator.

8 Claims, 8 Drawing Figures

AUTOMATIC PHASE AND FREQUENCY CONTROL SYSTEM

BACKGROUND OF THE INVENTION

This invention relates to oscillator control systems which perform the function of synchronizing a locally generated signal to an external input signal. In some systems, synchronization of frequency alone is sufficient while in others synchronization of both frequency and phase is required. Toward the latter function that of synchronizing phase and frequency the present invention is primarily directed.

While phase and frequency control systems vary greatly in construction, all must perform the same two basic functions in response to either of two conditions of operation. The first, called the acquisition, arises when the frequency of the input signal and the locally generated oscillator signal are different. The function of the control systems under these conditions is to compare the frequencies of the signals and produce a proportionate error voltage which is coupled to a voltage controlled oscillator in such manner that the frequency of the oscillator is changed to reduce the frequency difference. Once frequency synchronization is obtained, frequency acquisition is complete and the system then functions to obtain phase lock or phase acquisition, that is, provide a substantially constant predetermined phase relationship between the reference and locally generated signals.

In the simplest systems, generally referred to as the standard automatic phase control (APC), loop, the output signal of the local oscillator and the reference signal are applied to a multiplier or phase discriminator circuit which produces an output error signal indicative of the phase relationship between the two signals. This signal is coupled via a low pass filter to a frequency control point within the voltage controlled oscillator, completing the loop. During acquisition a non-symmetrical "beat" signal is produced by the multiplier which when filtered by the low pass filter provides a suitable "D.C." error voltage. Once acquisition is completed the multiplier output becomes a D.C. voltage suitable for attainment of phase synchronization.

While the APC systems perform the general function of frequency and phase synchronization satisfactorily in a variety of applications there is an inherent limitation in their performance. This limitation arises because the acquisition range and closed loop bandwidth of the system are both determined almost entirely by the bandwidth of the low pass filter and the loop gain. The criteria for wide acquisition range and stable in sync phase lock are diverse and in several respects actually oppose each other. For example increased acquisition range requires greater coupling of the nonsymmetrical beat note mentioned above which is obtained by increasing filter bandwidth. However, increases of bandwidth increase the noise bandwidths of the system causing a reduction in the stability and noise immunity of the system when phase locked. In many applications a compromise between acquisition range and noise bandwidth provides reasonable performance. However, if such compromised performance is not sufficient a standard phase lock loop can not be utilized.

This performance limitation in the standard APC loop has resulted in a number of improved systems which may be generally classified as either multiple loop systems or multiple mode systems. Typical of the former is the system set forth in U.S. Pat. No. 3,808,541 Baker et al in which an otherwise standard automatic phase control system is operated in conjunction with a frequency difference discriminator having an output signal indicative of the frequency difference between the local oscillator and reference signals. A filter network combines the outputs of the automatic phase control system and the frequency discriminating system for application to the local oscillator frequency control-circuitry.

Because the frequency difference detector output signal is zero when the frequencies of the reference and oscillator signals coincide, the output of the frequency difference loop is intended to have no effect upon the system once a frequency synchronization is obtained. In normal operation, the frequency difference output signal added to the normal automatic phase control error signal will not upset phase lock performance. However, this is true only in the absence of noise or if the input noise is symmetrical. Should the noise be asymmetrical or an interfering signal be present within the pass band of the reference signal, the frequency detector output will not be zero notwithstanding identical reference and oscillator frequencies. As a result, noise and extraneous signals may cause the frequency detector to contribute upsetting signals to the phase lock loop during in sync conditions. The acquisition and phase lock systems then are collateral but not totally independent and the in sync or phase lock performance of the combined system is determined in part by the noise bandwidth of the frequency detector portion of the system. Conversely the acquisition range of the system can not be optimized because the filter bandwidth must be reduced for noise immunity.

Two mode operational systems may be generally described as systems which operate in either of two modes each having different loop characteristics. The acquisition mode operates with a broad filter bandwidth while the phase lock mode operates with a reduced filter bandwidth. Such systems such as the well-known quadracorrelator system set forth in proceedings of the I.R.E., January 1954, Volume 42, No. 1, Page 288, "The DC Quadricorrelator: A Two-Mode Synchronization System" by Donald Richman have shown some improvement over conventional APC systems. However, two mode systems in general exhibit considerable transitory discontinuities when changing modes. The transition between modes is often abrupt and inaccurate particularly if noise is present with the signals.

OBJECTS OF THE INVENTION

Accordingly, it is an object of the present invention to provide an improved frequency and phase control system.

It is a further object of the present invention to provide a closed loop control system which simultaneously performs the functions of frequency and phase control.

It is a still further object of the present invention to provide an improved phase and frequency control system in which the acquisition and phase lock characteristics are independently determinable.

SUMMARY OF THE INVENTION

An automatic phase and frequency control system for maintaining phase and frequency synchronism between a locally generated signal and an input signal includes a source of oscillatory signal having a frequency responsive to a control signal; means producing first and second quadrature beat signals between the input and oscillatory signals. Translating means convert one of the beat signals to a constant amplitude signal having a phase which varies in a predetermined relationship to beat signal frequency and a multiplier responds to the other beat signal and the output signal of the translating means to develop a control signal. Filter means couple the control signal to the source of oscillatory signals for control of phase and frequency.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

DESCRIPTION OF THE PREFERRED EMBODIMENTS

Figure 1:
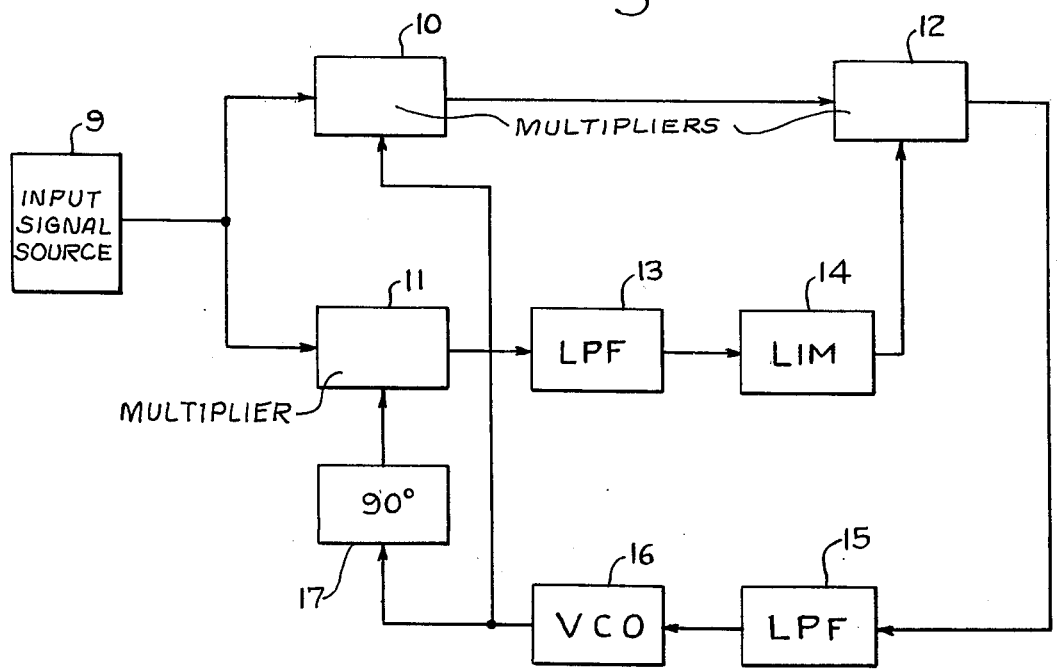
FIG 1 is a block diagram representation of a control system constructed in accordance with the present invention.

FIG. 1 shows a control loop system constructed in accordance with the present invention. An input signal is coupled to a pair of multipliers 10 and 11. The output signal of a voltage controlled oscillator (VCO) 16 is coupled to the remaining input terminals of multipliers 10 and 11. A 90° phase shift network 17 is interposed between oscillator 16 and multiplier 11. The output of multiplier 10 is coupled to one input terminal of a multiplier 12 while the output of multiplier 11 is coupled to a low pass filter 13 which in turn is coupled to a symmetrical limiter 14. The output of limiter 14 is coupled to the remaining input terminal of multiplier 12. The output of multiplier 12 is coupled via a low pass filter 15 to the control input terminal of voltage controlled oscillator 16. With the exception of filter 13 and limiter 14 the system components shown are of well-known construction.

Figure 7:
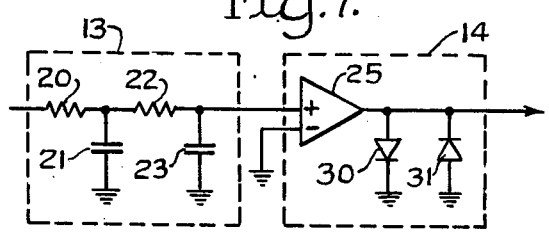
FIG. 7 is a schematic detail of a portion of the present invention system.
Figure 8:
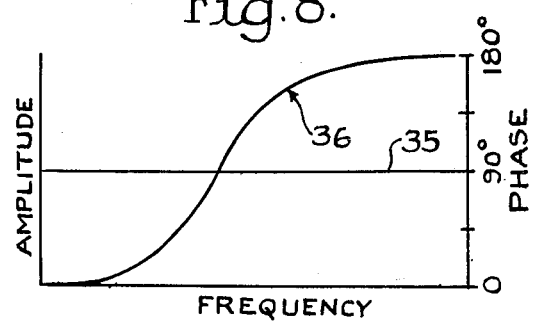
FIG. 8 is a graphical representation of the amplitude and phase characteristics of the system portion shown in FIG. 7.

FIG. 7 shows a schematic detail of one embodiment of filter 13 and limiter 14 which performs satisfactory. However, it should be obvious that numerous filter and limiter circuits can be used without departing from the spirit of the present invention. Filter 13 comprises a second order low pass network formed by a first section having a series resistor 20 and shunt capacitor 21 and a second section having a series resistor 22 and shunt capacitor 23. The phase shift characteristics of filter 13 are shown in the graph of FIG. 8 (line 36). Limiter 14 comprises an amplifier or gain block as is well known in the art coupled to a pair of oppositely poled diodes 30 and 31 which symmetrically limit the output signal of amplifier 25. The amplitude versus frequency characteristics of filter 13 and limiter 14 are shown by line 35 in FIG. 8.

The operation of the control circuit of FIG. 1 is best understood if discussed initially in a general sense with a more detailed discussion in conjunction with FIGS. 2 through 6 following. The familiar multiplier actions of multipliers 10 and 11 in response to the input signal and quadrature samples of the output of VCO 16 produce a pair of quadrature phase related beat signals together with sum signals which are removed by filters 13 and 15. While these quadrature beat signals are obtained by inducing a phase shift in an oscillator input it should be obvious that any combination of phase shift networks in either or both oscillator or input signal inputs may be used to produce quadrature beat signals without departing from the spirit of the present invention. The beat signal output of multiplier 10 is directly coupled to one input of multiplier 12 while the quadrature beat signal from multiplier 11 is converted by limiter circuit 14 and low pass filter 13 to a constant amplitude signal. Because low pass filter 13 has a predetermined phase versus frequency characteristic shown in FIG. 8, the phase delay which occurs within filter 13 (and therefore the phase of output signal of limiter 14) is a function of the signal frequency. Multiplication of the "squared" output signal of limiter 14 and the sinusoidal like beat signal output of multiplier 10 produces an error signal of constant amplitude having a D.C. component which varies with beat signal frequency. This D.C. component is coupled by filter 15 to VCO 16 producing acquisition. Once the frequencies of VCO 16 and the input signal are equal, the output of limiter 14 becomes a D.C. voltage and normal phase lock operation continues.

A more detailed description of the operation of the present invention control system is best facilitated by simultaneous reference to the block diagram of FIG. 1 together with the curves shown in FIGS. 2 through 5. For convenience the individual curves of the Figures will be referred to by the Figure number in conjunction with the letter of the curve. FIGS. 2A through 2F depict the signals present within the circuit in acquisition operation when the input signal is at a higher frequency than the output signal of oscillator 16. The beat signal outputs of multipliers 10 and 11 are shown in FIGS. 2A and 2B respectively. It should be noted that a quadrature relationship exists in which the output of multiplier 11 leads that of multiplier 10 by 90°. The signal shown in FIG. 2A is coupled directly to one input of multiplier 12 and that shown in FIG. 2B is applied to low pass filter 13. The output of filter 13 (shown in FIG. 2C) shows a 90° lagging phase shift to have occurred within the filter. Two aspects are worth noting here, first the phase shift is lagging because the input signal frequency is greater than the frequency of oscillator 15 and second, the amount of phase shift is 90° because of the phase shift characteristics designed into filter 13. Should the frequencies differ by a lesser amount (as is shown below) a reduced lagging phase shift would occur in low pass filter 13. Limiter 14 converts the phase shifted sinusoidal beat signal of FIG. 2C to a substantially amplitude limited periodic signal (shown in FIG. 2D) having the same phase as the waveform in FIG. 2C.

At this point it should be noted that under the conditions shown the square wave of FIG. 2D is in phase with the beat signal shown in FIG. 2A. As mentioned, this phase relationship results from the phase shift produced by low pass filter 13. The conditions shown are of special interest because they represent the maximum error voltage output of the system. The frequency corresponding to this phase condition is determined by the phase shift characteristics of filter 13 and is largely a matter of design choice The application of the square wave signal shown in FIG. 2D, and the sinusoidal beat signal of FIG. 2A to the inputs of multiplier 12 produces an output signal which is essentially the full wave rectification of the beat signal in FIG. 2A. This waveform shown in FIG. 2E is then filtered by low pass filter 15 to form the waveform in FIG. 2F which is a DC voltage suitable for application to the control circuitry within VCO 16.

Figure 2:
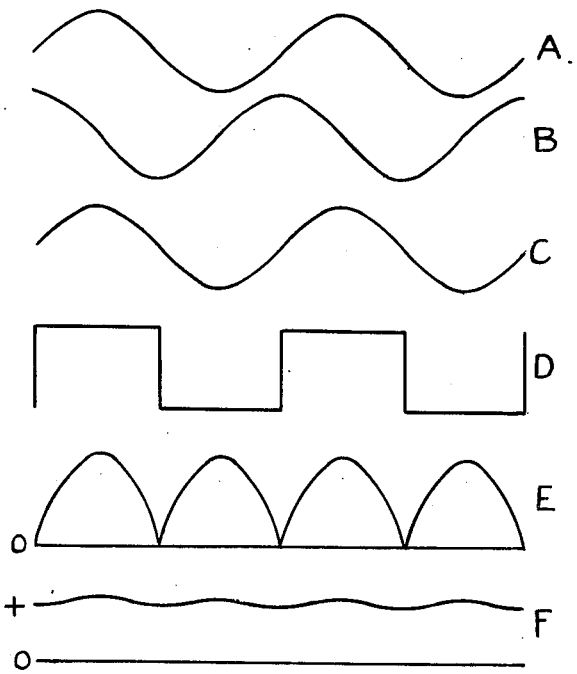
FIGS. 2 through 6 are waveforms of signals within the inventive system under varied operational conditions.
Figure 3:
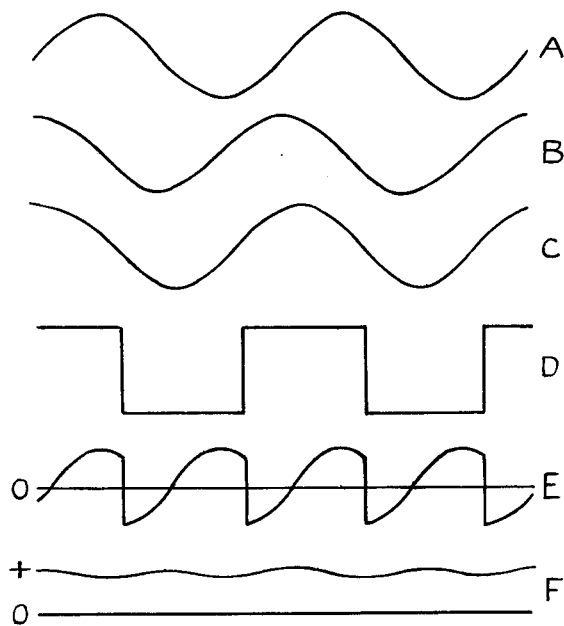

FIG. 3 shows a set of curves similar to those shown in FIG. 2 which represent system operation when the frequency of oscillator 16 is again less than that of the input signal but differing by a substantially smaller amount than that shown in the maximum condition of FIG. 2. As may be seen waveforms 3A and 3B are substantially the same as FIGS. 2A and 2B. This is because the quadrature relationship established is unaffected by the extent of frequency difference. However, it should be noted that the phase relationship between waveform 3C and waveforms 3A and 3B is different than that between waveform 2C and waveforms 2A and 2B. This is due, of course, to the reduced lagging phase shift produced by low pass filter 13. FIG. 3D shows the wave form of FIG. 3C converted to a constant amplitude "square wave" by the action of limiter 14 and waveform 3E shows the result of multiplying waveforms 3D and 3A in multiplier 12. Waveform 3E is not a full wave rectification of FIG. 3E but rather a composite signal resulting from the multiplication process in multiplier 12. This process is most simply understood if considered a polarity switching operative upon the input signal 3A in response to constant amplitude signal 3D. When thus viewed the output signal of multiplier 12 (shown in FIG. 3F) is easily understood. Examination of the signal shown in FIG. 3F shows that while portions of each polarity exist in the output signal, the areas above and below the base line of the curve are not equal but rather the positive portions are substantially greater than (i.e. "outweigh") the negative portions. As a result, when this signal is filtered by low pass filter 15, a positive DC voltage results which is less than that obtained under maximum frequency difference, but is nontheless a substantial positive voltage which when applied to voltage controlled oscillator 16 will effect the correct oscillator frequency shift to compensate for the frequency difference between the oscillator and the input signal.

This acquisition process continues and successive comparisons of the input and oscillator signals reduce the frequency difference toward zero.

The final portion of the acquisition process is readily understood if the condition just prior to frequency synchronization is analyzed. This condition (depicted in FIG. 4) should be understood to be an idealization of the system operation as the frequencies of VCO 16 and the input signal become extremely close. It should be further understood that the frequency of the beat signals produced by multipliers 10 and 11 will be of much lower frequency than those shown in FIGS. 2 and 3 and are depicted here in a disproportionately short time scale for convenience.

FIGS. 4A and 4B show the same quadrature outputs for multipliers 10 and 11 as earlier figures. Waveform 4C however, shows that a near zero phase shift has occurred in low pass filter 13 causing its output signal to remain essentially in-phase with the output of multiplier 11 and in quadrature with the output of multiplier 10. Correspondingly, the constant amplitude signal shown in FIG. 4D is also in quadrature with the output signal of multiplier 10 shown in FIG. 4A. FIG. 4C shows the output of multiplier 12 resulting from this condition of input signals. The important point to observe in FIG. 4E is that substantially equal portions of the signal are present above and below the base line. As a result, integration of this waveform within low pass filter 15 results in a substantially zero DC voltage (shown in FIG. 4F) which when applied to voltage controlled oscillator 16 produces little or no average change in oscillator frequency.

In other words, once the system has caused the VCO frequency to be substantially equal to that of the reference signal, the acquisition system output voltage average is substantially zero and frequency synchronization is obtained. It is important to note that as the system approaches zero, the amplitude of wave form 4E does not diminish in the manner typical of prior art systems frequency control. This is advantageous in the phase lock operation of the system which is described below. In contrast, prior art frequency control systems exhibit a corresponding diminution of the error signal amplitude as the system approaches synchronization and therefore cannot function effectively as a phase control system.

Figure 5:
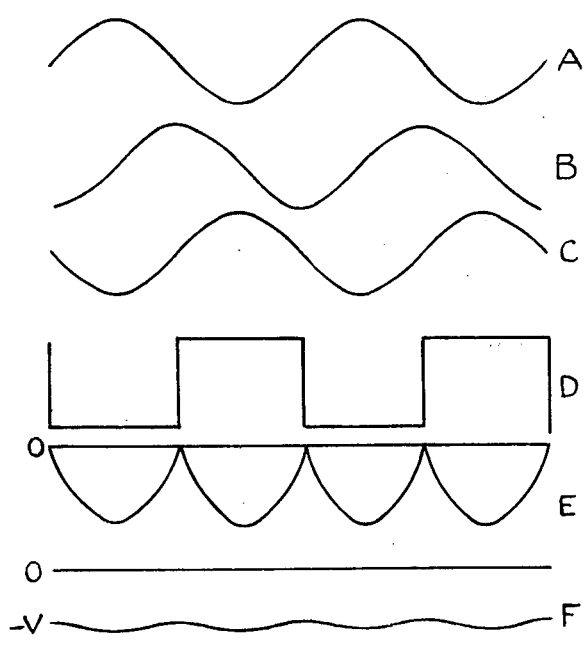

FIG. 5 shows a set of curves similar to those shown in FIG. 2 but depicting frequency acquisition operation of the present invention system when the reference frequency signal is less than that of VCO 16 under maximum error voltage conditions. As would be anticipated, the operation of the system remains essentially the same. However, the quadrature relationship between the outputs of multipliers 10 and 11 (FIGS. 5A and 5B) is the reverse of that shown in FIGS. 2A and 2B. That is, the output of multiplier 11 while in quadrature with the output of multiplier 10 has a lagging phase rather than the leading phase shown in FIGS. 2A and 2B. This opposite phase shift is inherent in the action of multipliers 10 and 11. As is well-known, when the oscillator frequency is greater than that of the input signal, the beat signal produced by a pair of quadrature multipliers is 180° out of phase with the beat signal produced when the frequency relationships are reversed.

Because low pass filter 13 responds only to the frequency of the beat signal and does not respond to the relationship between beat signals, low pass filter 13 again produces a lagging phase shift of 90° yielding the signal shown in FIG. 5C. FIG. 5D shows the constant amplitude signal in phase with that of FIG. 5C produced by the action of limiter 14. Due to the opposite phase relationship between the beat signals of FIG. 5 and those of FIG. 2, constant amplitude signal 5D is 180° out of phase with the beat signal 5A and multiplication within multiplier 12 results in a similar but reverse polarity full wave rectified output signal (shown in FIG. 5E) which when filtered by low pass filter 15 produes the negative voltage "maximum" shown in FIG. 5F. This negative voltage represents the opposite maximum acquisition voltage of the system.

Figure 6:
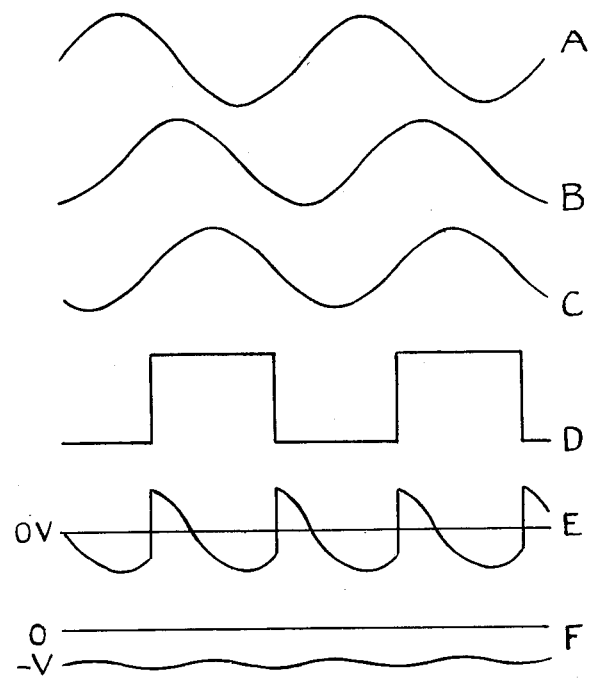

FIG. 6 depicts system operation when the oscillator frequency is above that of the input signal by an amount less than the maximum shown in FIG. 5. The operation is directly analogous to that of FIG. 3 and need not be explained in great detail. It should be apparent that a reduced negative error voltage is produced.

Figure 4:
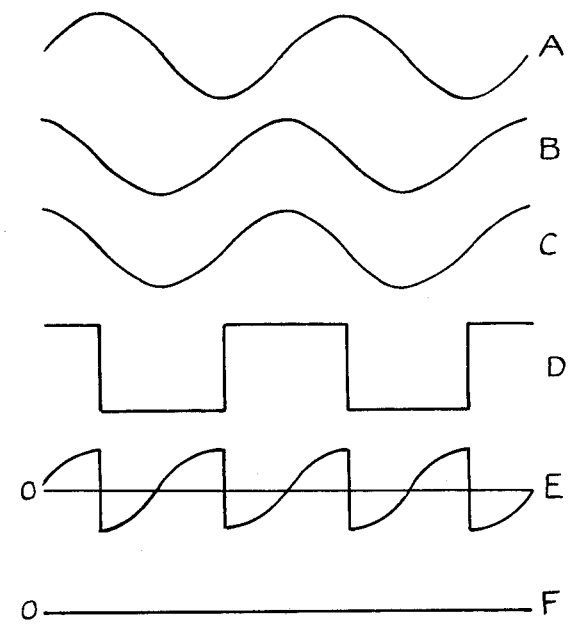

Once frequency acquisition is complete, that is, the frequencies of VCO 16 and the input signal are substantially equal lock has occurred and as depicted in FIG. 4 the frequency difference detecting portion of the system ceases to contribute to the error voltage. As mentioned above, the output of multiplier 12 is not diminished as frequency lock is obtained but rather becomes a very low frequency signal having a near zero DC average. This facilitates the phase lock function of the present invention system. Because the frequencies of the input and VCO signals are close (i.e. small static frequency error) the beat signal is low enough in frequency to pass through filter 15 causing a modulation of VCO 16 frequency. The extent of frequency "swing" thus caused will affect phase lock in either of two ways.

The first, and most desirable, occurs if the static frequency error of the system, that is, the in-sync frequency difference between the input and VCO signals is less than the beat note caused VCO frequency excursions. In this case, phase lock is obtained the instant the VCO frequency exactly coincides with the input signal. The second type of phase lock occurs if the static frequency error exceeds the VCO frequency excursions by the familiar asymmetrical beat note formation well known in automatic phase lock system as "pull-in."

In either type of phase lock operation the output signals of multipliers 10 and 11 become DC voltages proportional to the phase differences between their respective input signals. Since the signals applied to multiplier 10 are substantially in quadrature, a near zero DC output signal results while the in-phase inputs of multiplier 11 (due to the action of phase shifter 17) cause a near maximum positive output voltage. The output of multiplier 11 is passed by low pass filter 13 causing limiter 14 to apply a positive voltage to one input of multiplier 12. The near zero output voltage of multiplier 10 is coupled directly to multiplier 12 which couples it substantially unchanged via low pass filter 15 to VCO 16 controlling the oscillator phase and maintaining phase lock. Simply stated, the actions of multiplier 11, low pass filter 13, and limiter 14 produce no effect upon the error signal developed by multiplier 10 once acquisition (evidenced by DC output signals from multipliers 10 and 11) is obtained. Multiplier 10, low pass filter 15, and oscillator 16 perform the standard APC functions to maintain phase synchronization.

Because the output of limiter 14 is essentially binary, that is, characterized by either of two voltage states, the present invention system exhibits two equal probability stable phase lock states. The first is the same as that exhibited by prior art phase lock systems when the input and VCO signals are in quadrature. The second arises when the output of limiter 14 "switches" and corresponds to a 270° phase relationship between input and VCO signals.

With this understanding of system operation, an important advantage of the present invention system becomes apparent upon the realization that low pass filter 13 contributes to system performance only during the period of frequency acquisition and is rendered non-contributory thereafter. The static, or phase lock, performance of the system is entirely independent of the filter characteristics (i.e., band width) of low pass filter 13. Conversely, once frequency acquisition has occurred, the closed loop phase lock performance of the system is controlled entirely by the noise bandwidth of low pass filter 15. As a result, the filter characteristics of low pass filters 13 and 15 may be individually designed to maximize their respective contributions to system performance. The noise bandwidth characteristics of the two need not be compromised to facilitate operation but are instead entirely independent.

Further advantages of the present system become apparent with the introduction of noise, either symmetrical or non-symmetrical into the system. Because limiter 14 maintains a maximum output signal during phase lock, symmetrical variations in the output of multiplier 11 will be produced by either symmetrical or non-symmetrical noise which when filtered by filter 13 will not substantially contribute to the voltage applied to oscillator 16. Therefore, as long as the signal-to-noise ratio of the input is greater than 0db, the frequency difference detecting portion of the system, that is, multiplier 11, low pass filter 13, and limiter 14 will not contribute noise to the phase lock loop portion of the system.

Similarly, the introduction of noise into multiplier 10, whether symmetrical or non-symmetrical, will produce symmetrical variations in the output signal which have a zero DC average when filtered by low pass filter 15 and will not contribute to voltage applied to oscillator 15.

As a result, the closed loop noise bandwidth of the frequency and phase lock loop of the present invention is completely independent of the acquisition range of the frequency difference detecting portion of the system. The noise bandwidth is determined by the loop gain of the phase lock portion and the bandwidth of low pass filter 15 and is not dependent upon the bandwidth of filter 13 within the frequency difference detecting segments of the system.

What is claimed is:

1. An automatic phase and frequency control system for producing phase and frequency synchronism between a locally generated signal and an input signal comprising:

oscillator means producing an oscillatory signal having a frequency responsive to a control signal;

generating means producing first and second beat signals between said input signals and said oscillatory signal, said beat signals having a substantially quadrature relationship;

translating means converting said first beat signal to a constant amplitude signal having a phase relative to said second beat signal which varies in a predetermined relationship to said beat signal frequency, said translating means being capable of coupling a D.C. signal;

first multiplying means multiplying said second beat signal and the output signal of said translating means to develop a control signal, said second beat signal being applied to said multiplying means such that the relative amplitude of said output signal of said translating means and said second beat signal remain substantially constant and the relative phase therebetween varies as a function of beat signal frequency; and first filter means coupling said control signal to said oscillator means.

2. An automatic phase and frequency control system as set forth in claim 1 wherein said translating means includes:

second filter means, including a low-pass filter, coupled to said generating means, producing a phase shift in signals coupled therethrough which has a predetermined relationship to signal frequency,.

3. An automatic phase and frequency control system as set forth in claim 2 wherein said translating means includes:

limiting means, coupled to said second filter means and said first multiplying means, producing symmetrical amplitude limiting of said first beat signal.

4. An automatic phase and frequency control system as set forth in claim 3 wherein said generating means include:
- second and third multiplying means each responsive to said output signal of said oscillator means and said input signal;
- means coupling in-phase samples of said input signal to said second and third multiplying means; and
- quadrature means coupling quadrature phased samples of said oscillator means output signal to said second and third multiplying means.

5. An automatic phase and frequency control system as set forth in claim 4 wherein said quadrature means include:
- a 90° phase shift network interposed between said third multiplying means and said oscillator means.

6. An automatic phase and frequency control system as set forth in claim 3 wherein said generating means include:
- second and third multiplying means each responsive to said output signal of said oscillator means and said input signal;
- quadrature means coupling quadrature phased samples of said input signal to said second and third multiplying means; and
- means coupling in-phase samples of said oscillator means output signal to said second and third multiplying means.

7. An automatic phase and frequency control system as set forth in claim 6 wherein said quadrature means include:
- a 90° phase shift network coupling said input signal to said second multiplying means.

8. An automatic phase and frequency control system for maintaining phase and frequency synchronism between a locally generated signal and an input signal:
- a voltage controlled oscillator producing an oscillatory signal having a frequency determined by an applied control signal;
- a first and a second multiplier each producing an output signal equal to the product of two input signals;
- means coupling the output signal of said voltage controlled oscillator and said input signal to the respective inputs of said first and second multipliers such that the output signals of said first and second multipliers are in quadrature;
- a first low pass filter, coupled to the output of said second multiplier having a predetermined phase delay characteristic producing a phase shift which varies as a function of signal frequency;
- a limiter, coupled to said first low pass filter, symmetrically limiting the amplitude of the output signal of said first low pass filter;
- a third multiplier, responsive to the output signals of said limiter and said first multiplier, producing an output signal equal to the product thereof, the output signal of said first multiplier being applied to said third multiplier such that the relative amplitudes of said output signals of said limiter and said first multiplier remain substantially constant and the relative phase therebetween varies as a function of beat signal frequency; and
- a second low pass filter coupling the output signal of said third multiplier to the control signal input of said voltage controlled oscillator.

* * * * *